United States Patent [19]
Iacovangelo et al.

[11] Patent Number: 5,567,985
[45] Date of Patent: Oct. 22, 1996

[54] ELECTRONIC APPARATUS WITH COMPLIANT METAL CHIP-SUBSTRATE BONDING LAYER(S)

[75] Inventors: Charles D. Iacovangelo, Niskayuna; Paul J. DiConza, Clifton Park, both of N.Y.

[73] Assignee: General Electric Company, Schenectady, N.Y.

[21] Appl. No.: 457,551

[22] Filed: Jun. 1, 1995

Related U.S. Application Data

[63] Continuation-in-part of Ser. No. 279,379, Jul. 25, 1994, abandoned.

[51] Int. Cl.$^6$ ............................. H01L 23/02; H01L 39/02
[52] U.S. Cl. .......................... 257/701; 257/705; 257/707; 257/720
[58] Field of Search ...................................... 257/701, 702, 257/705, 707, 706, 717, 720

[56] References Cited

U.S. PATENT DOCUMENTS

| | | | |
|---|---|---|---|
| 4,788,627 | 11/1988 | Ehlert et al. | 361/386 |
| 5,324,987 | 6/1994 | Iacovangelo et al. | 257/701 |
| 5,356,661 | 10/1994 | Doi et al. | 257/701 |

FOREIGN PATENT DOCUMENTS

| | | | |
|---|---|---|---|
| 113088 | 12/1983 | European Pat. Off. | 257/701 |
| 194475 | 2/1986 | European Pat. Off. | 257/701 |
| 297569 | 6/1988 | European Pat. Off. | 257/701 |
| 538798 | 10/1992 | European Pat. Off. | 257/701 |
| 56-085842 | 12/1979 | Japan | 257/701 |

*Primary Examiner*—Donald L. Monin, Jr.
*Attorney, Agent, or Firm*—William H. Pittman

[57] ABSTRACT

Differences in thermal expansion properties between integrated circuit chips, especially of gallium arsenide, and the dielectric substrates (especially diamond and aluminum nitride) on which said chips are mounted are accommodating by interposing between the substrate and the chip a mixed metal layer comprising at least one ductile, thermally conductive metal such as copper and at least one other metal, preferably a refractory metal, having a lower coefficient of thermal expansion, preferably tungsten. A compliant metal layer, typically of aluminum, silver, copper or gold, is preferably interposed between the substrate and the mixed metal layer.

20 Claims, No Drawings

ELECTRONIC APPARATUS WITH COMPLIANT METAL CHIP-SUBSTRATE BONDING LAYER(S)

CROSS-REFERENCE TO RELATED APPLICATIONS

This application is a continuation-in-part of application Ser. No. 08/279,379, filed Jul. 25, 1994 now abandoned.

BACKGROUND OF THE INVENTION

This invention relates to electronic apparatus, and more particularly to apparatus having one or more integrated circuit chips affixed to an electrically insulating substrate.

Integrated circuit chips are now a major factor in the fabrication of electronic devices. In particular, multichip modules are in common use. Such modules are frequently constructed by affixing a number of chips to a dielectric substrate, typically ceramic, and connecting the chips through conductive paths or vias which may pass through holes in the substrate. A typical chip material is gallium arsenide.

Electronic activity in the chip is accompanied by the generation of varying amounts of heat, which is discharged in large part by transmission to and through the substrate. As the packing density of chips increases, the amount of heat which must be discharged naturally also increases. It is usually desirable to employ a substrate material with a high thermal conductivity. Aluminum nitride is an example of a ceramic substrate material having the desired thermal and electrical properties.

A problem arises, however, by reason of the differing degrees of thermal expansion of gallium arsenide and aluminum nitride. Their coefficients of thermal expansion are about 6.5 and 4.5 ppm./° C., respectively. Thus, thermally induced tensile stresses are along the adhesion interface between the chip and the substrate, placing the chip under severe tension.

When the size of the chips, and especially the area of attachment of a chip to the substrate, is relatively small, such thermal stresses are fairly easily discharged and do not present a problem. This is true, for example, in the case of laser diodes whose lateral dimensions are typically on the order of 0.5 mm. However, chips employed for other purposes are increasing in size, typically being as large as 12 mm. in length and/or width with dimensions up to 6 mm. being commonplace. Such chips are also typically very thin, often on the order of 100 microns. When this is the case, the large tensile stresses between the chip and the substrate can result in various detrimental effects such as cracking of the chip or its separation from the substrate.

By reason of its extremely high thermal conductivity and electrical resistivity, diamond is becoming of greater interest as a substrate material for integrated circuits. While single-crystal diamond as exemplified by natural diamond may be used for this purpose, synthetic polycrystalline diamond is more common because of its substantially lower cost. Such diamond may be prepared, for example, by chemical vapor deposition (CVD). However, the thermal expansion difference between gallium arsenide and diamond is even greater than that between gallium arsenide and aluminum nitride, since the coefficient of thermal expansion of CVD diamond is only on the order of 1.5 ppm./° C.

Attempts have been made to overcome this difference in thermal expansion tendency by employing such materials as soft solders and conductive epoxy resins as adhesives to affix the chip to the substrate. Such materials, however, are themselves not fully resistant to the tensile stresses induced. Moreover, their thermal conductivity is much lower than that of diamond, which to some extent defeats the purpose of having a diamond substrate.

A different approach to the thermal expansion problem is described in U.S. Pat. No. 5,324,987. It involves the interposition between the substrate and chip of a plurality of diamond pedestals in combination with areas of other material, typically metal of high thermal conductivity, having a higher coefficient of thermal expansion than said substrate. Despite its success, however, this approach is less than ideal because of the difficulty and expense of machining the diamond pedestals and the necessity to custom-match the substrate to the chips being mounted thereon.

It is highly desirable, therefore, to develop an alternative means for attaching integrated circuit chips, especially gallium arsenide chips, to substrates of high thermal conductivity such as aluminum nitride and diamond. It is further desirable for the attaching material to permit grading of the stresses induced by the large differences in thermal expansion between the chips and the substrate. Said means must be adaptable to soldering and wire bonding operations.

SUMMARY OF INVENTION

These goals are achieved by the present invention. The electronic structures of the invention demonstrates excellent adhesion of integrated circuit chips mounted on substrates having comparatively low CTE's, while preserving integrity of the chips so mounted. Moreover, said structures are capable of surviving severe thermal shock and temperature cycling conditions.

The invention is an electronic structure comprising:
- a substrate comprising a dielectric material with a metallizable surface;
- a mixed metal layer having a thickness of at least about 5 microns deposited over said substrate, said mixed metal layer comprising at least one ductile, thermally conductive metal having a coefficient of thermal expansion of at least about 7 ppm./° C. and at least one other metal having a coefficient of thermal expansion up to about 5 ppm./° C.; and
- at least one integrated circuit chip mounted with one side in contact with said mixed metal layer and with no non-metallic solid materials, said chip comprising a material having a higher coefficient of thermal expansion than said substrate.

In a preferred aspect, the invention further comprises a compliant layer having a thickness of at least about 20 microns between said mixed metal layer and said substrate, said compliant layer consisting of at least one ductile, thermally conductive metal.

DETAILED DESCRIPTION; PREFERRED EMBODIMENTS

The integrated circuit chips whose use is contemplated according to the present invention are those comprising materials having high coefficients of thermal expansion (hereinafter sometimes "CTE"). In general, the CTE of the chip is higher than that of the dielectric substrate on which it is mounted. The invention is particularly useful for chips having a CTE greater than about 4.5 ppm./° C. One such material is gallium arsenide, for which the value is 6.5 ppm./° C. Further, the invention has particular utility with chips of a relatively large size, especially having a length, width or both greater than about 1 mm.

Another element of the invention is a dielectric substrate on which at least one and usually a plurality of such chips are mounted. Suitable dielectric materials for said substrate include diamond, especially polycrystalline diamond and preferably CVD diamond, and ceramics such as aluminum nitride. Such materials generally have a substantially different CTE than the chips mounted thereon. The substrate CTE is often lower, typically at least about 1 and frequently at least about 4 ppm./° C. lower.

A mixed metal layer having a thickness of at least about 5 and preferably about 10–20 microns is disposed between the chip the dielectric substrate. On its mounted side, said chip is in contact only with metal; thus, the invention does not include the presence of solid diamond pedestals as disclosed in the aforementioned U.S. Pat. No. 5,324,987. In the absence of a compliant layer as described hereinafter, the minimum effective thickness for the mixed metal layer is generally about 10 microns.

Said mixed metal layer comprises at least one ductile, thermally conductive metal, typically having a CTE of at least about 7 and preferably at least about 10 ppm./° C., in combination with at least one other metal, preferably a refractory metal, having a CTE up to about 5 ppm./° C. Under certain conditions, it may also be advantageous for the ductile metal to be electrically conductive and patterned to facilitate the formation of electrical connections therewith. It is not required and generally not preferred that the two metals in the mixed metal layer be capable of forming an alloy; a simple mechanical mixture of the two is effective for the purposes of the invention.

The preferred ductile metal is copper by reason of its relatively low cost, high ductility and advantageous electrical and thermal conductivity properties, as well as its high CTE (16.4 ppm./° C.). Tungsten, with a CTE of 4.6 ppm./° C., is generally preferred as the other metal.

The proportions of the metals in the mixed metal layer may be adjusted so as to provide a material having a CTE equal to or slightly higher than that of the chip. A slightly higher (e.g., about 0.3–2.0 ppm./° C. higher) CTE is often preferred since the brittle chip will then be under slight compression rather than tension when the structure is cooled from the die-attach temperature, thus promoting stability. For a CVD diamond substrate, excellent performance as the mixed metal layer is provided by a mixture comprising about 80–90% by weight tungsten, with the balance being copper. An 80% tungsten mixture has a CTE of 8.3 ppm./° C.

The preferred aspect of the invention includes a compliant metal layer with a thickness of at least about 20 microns interposed between the substrate and the mixed metal layer. Metals suitable for the compliant layer are those which are ductile, thermally (and sometimes also electrically, as disclosed hereinabove) conductive. These include aluminum, silver, copper and gold, with aluminum and silver often being preferred by reason of their particular effectiveness.

The structures of this invention generally include other metal layers in addition to the hereinabove-described layers. For example, a substrate bond coat of titanium or, preferably, a titanium-tungsten alloy (typically 90% by weight tungsten with the balance titanium), or a combination thereof, most often about 1000–2000 Å thick, may be deposited on the substrate prior to deposition of the mixed metal and (optionally) compliant layers. The integrated circuit chip is generally metallized with tungsten-titanium followed by a gold oxidation-resistant layer, the two layers typically having thicknesses of about 2000 and 5000 Å, respectively. A solder bond coat of silver or gold, typically having a thickness of about 1000–3000 Å, is usually applied between the metallized chip and the metal layers on the substrate prior to die-attach. Diffusion barriers, preferably of tungsten-titanium as described hereinabove or chromium, having a thickness of about 500–7500 Å, may be interposed between the mixed metal layer and the solder bond coat, compliant layer or both. For the purposes of the invention, any metal layers deposited on the chip or disposed between the chip and the mixed metal layer are considered part of the chip.

The metal layers in the structures of this invention are typically produced by sequential sputtering onto the substrate, but other methods of metal deposition may also be employed. Finally, solder is applied, typically to a thickness of about 25–100 microns, and the chip is mounted in the die-attach step. A hard solder such as gold-tin is most often employed for die-attach, although lead-tin and similar soft solders may also be used. Temperatures in the range of about 300°–350° C. are typically employed for the die-attach step.

The method of this invention is illustrated by the following examples. All percentages are by weight. Metal layers were deposited by sputtering unless otherwise stated. The tungsten-titanium alloy employed contained 90% tungsten, and the tungsten-copper mixture contained 80% tungsten. The gallium arsenide chips were coated with approximately 2000 Å of tungsten-titanium alloy and 5000 Å of gold prior to die-attach, which was done using solder preforms unless otherwise stated. "Blank" chips, 5 mm. square and 0.5 mm. thick, were unpatterned, and "working" chips, 5×3.5×0.2 mm., contained electronic circuitry. Thermal cycling tests were performed in an environmental chamber between temperatures of 150° and −65° C., with 30 minutes at each temperature.

EXAMPLE 1

A CVD diamond substrate was provided with the following metal layers:

Bond layer: tungsten-titanium, 1000 Å;
Mixed metal layer: tungsten-copper, 12.7 microns;
Solder bond layer: gold, 1000 Å.

A blank chip was applied and die-attach, using a 50-micron Au—Sn foil preform, was achieved by heating at about 310° for 10–20 seconds, after which the structure was cooled to room temperature.

Examination under a microscope showed that no cracks were present in the metal layers separating the diamond from the gallium arsenide. The structure survived 20 thermal cycles without cracking. Similar structures having mixed metal layers with a thickness of less than 10 microns displayed cracking.

EXAMPLE 2

Following the procedure of Example 1, a substrate was provided with the following metal layers:

Bond layer: tungsten-titanium, 1000 Å;
Compliant layer: silver, 25.4 microns;
Mixed metal layer: tungsten-copper, 6.4 microns;
Solder bond layer: gold, 2000 Å.

The resulting structure was free from cracks and survived 80 thermal cycles. It also survived the thermal shock of contact with solid carbon dioxide at −70° C.

EXAMPLE 3

Following the procedure of Example 1, a substrate was provided with the following metal layers:

Bond layer: tungsten-titanium, 1000 Å;
Compliant layer: gold, 2000 Å sputtered and 76.2 microns electroplated:
Mixed metal layer: tungsten-copper, 6.4 microns;
Solder bond layer: silver, 2500 Å. Similar results were obtained with the blank chip and with a working chip.

EXAMPLE 4

Following the procedure of Example 1, a substrate was provided with the following metal layers:

Bond layer: tungsten-titanium, 1000 Å, followed by titanium, 500 Å;
Compliant layer: aluminum, 25.4 microns;
Diffusion barrier: chromium, 5000 Å;
Mixed metal layer: tungsten-copper, 12.7 microns;
Diffusion barrier: tungsten-titanium, 1000 Å;
Solder bond layer: gold, 2000Å.

Similar results were obtained with the blank chip and with a working chip.

EXAMPLE 5

Following the procedure of Example 1, a substrate was provided with the following metal layers:

Bond layer: tungsten-titanium, 1000 Å;
Compliant layer: aluminum, 25.4 microns;
Diffusion barrier: tungsten-titanium, 1000 Å;
Mixed metal layer: tungsten-copper, 11.4 microns;
Diffusion barrier: tungsten-titanium, 1000Å;
Solder bond layer: gold, 1000 Å.

A 2-micron layer of gold-tin solder was applied by sputtering, followed by a working chip. Similar results were obtained.

What is claimed is:

1. An electronic structure comprising:
   a substrate comprising a dielectric material with a metallizable surface;
   a mixed metal layer having a thickness of at least about 5 microns deposited over said substrate, said mixed metal layer comprising at least one ductile, thermally conductive metal having a coefficient of thermal expansion of at least about 7 ppm./°C. and at least one other metal having a coefficient of thermal expansion up to about 5 ppm./°C.; and
   at least one integrated circuit chip mounted with one side in contact with only said mixed metal layer, said chip comprising a material having a higher coefficient of thermal expansion than said substrate.

2. A structure according to claim 1 wherein the dielectric material is diamond.

3. A structure according to claim 2 wherein the diamond is polycrystalline diamond.

4. A structure according to claim 2 wherein the integrated circuit chip is of gallium arsenide.

5. A structure according to claim 4 wherein the thickness of the mixed metal layer is at least about 10 microns.

6. A structure according to claim 5 wherein the ductile metal is copper.

7. A structure according to claim 6 wherein the other metal is tungsten.

8. A structure according to claim 7 wherein the mixed metal layer comprises about 80–90% tungsten.

9. A structure according to claim 4 further comprising a substrate bond coat between the substrate and the mixed metal layer.

10. A structure according to claim 4 wherein the integrated circuit chip is metallized.

11. A structure according to claim 4 further comprising at least one metal layer selected from the group consisting of solder bond coats and diffusion barriers.

12. A structure according to claim 4 further comprising a compliant layer having a thickness of at least about 20 microns between said mixed metal layer and said substrate, said compliant layer consisting of at least one ductile, electrically conductive metal.

13. A structure according to claim 12 wherein the compliant layer is of aluminum, silver, copper or gold.

14. A structure according to claim 12 wherein the thickness of the mixed metal layer is about 10–20 microns.

15. A structure according to claim 12 wherein the ductile metal is copper.

16. A structure according to claim 15 wherein the other metal is tungsten.

17. A structure according to claim 16 wherein the mixed metal layer comprises about 80–90% tungsten.

18. A structure according to claim 12 further comprising a substrate bond coat between the substrate and the mixed metal layer.

19. A structure according to claim 12 wherein the integrated circuit chip is metallized.

20. A structure according to claim 12 further comprising at least one metal layer selected from the group consisting of solder bond coats and diffusion barriers.

* * * * *